(12) United States Patent
Browne et al.

(10) Patent No.: US 6,955,747 B2
(45) Date of Patent: Oct. 18, 2005

(54) CAM DRIVEN PADDLE ASSEMBLY FOR A PLATING CELL

(75) Inventors: Robert M. Browne, San Jose, CA (US); Donald G. Allen, Morgan Hill, CA (US); Hank Reinstein, Livermore, CA (US); Todd Thomas, Danville, CA (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 10/253,249

(22) Filed: Sep. 23, 2002

(65) Prior Publication Data

US 2004/0055876 A1    Mar. 25, 2004

(51) Int. Cl.[7] ............................. C25D 7/12; C25D 17/02
(52) U.S. Cl. ..................................................... 204/273
(58) Field of Search ............................... 204/242, 273; 74/828, 838, 839

(56) References Cited

U.S. PATENT DOCUMENTS

| | | | |
|---|---|---|---|
| 3,480,522 A | | 11/1969 | Brownlow ................. 204/40 |
| 3,652,442 A | | 3/1972 | Powers et al. ............. 204/273 |
| 3,668,940 A | * | 6/1972 | Avena et al. .............. 74/424.93 |
| 3,672,587 A | * | 6/1972 | Pierce ...................... 242/483.5 |
| 4,102,756 A | | 7/1978 | Castellani et al. ............ 204/43 |
| 4,120,578 A | * | 10/1978 | Daniels et al. ............. 399/200 |
| 4,123,182 A | * | 10/1978 | Kondur, Jr. ................. 400/328 |
| 4,175,876 A | * | 11/1979 | Hanaoka ..................... 400/185 |
| 4,362,593 A | * | 12/1982 | Grevich ...................... 156/498 |
| 4,448,093 A | * | 5/1984 | Moller ......................... 74/821 |
| 4,487,085 A | * | 12/1984 | Collins ......................... 74/113 |
| 5,033,853 A | * | 7/1991 | Frangineas, Jr. ............ 356/450 |
| 5,312,532 A | | 5/1994 | Andricacos et al. ........ 204/231 |
| 5,316,642 A | | 5/1994 | Young, Jr. et al. .......... 204/198 |
| 5,328,585 A | * | 7/1994 | Stevenson et al. ....... 204/298.2 |
| 5,440,926 A | * | 8/1995 | Lew et al. .................... 73/259 |
| 5,516,412 A | | 5/1996 | Andricacos et al. ........ 204/224 |
| 5,570,632 A | * | 11/1996 | Cumens et al. .............. 101/35 |
| 5,787,849 A | * | 8/1998 | Mitchell ................... 123/90.17 |
| 5,804,456 A | | 9/1998 | Aintila ........................ 437/183 |
| 6,082,603 A | * | 7/2000 | Takada et al. .............. 226/157 |
| 6,547,937 B1 | * | 4/2003 | Oberlitner et al. ...... 204/224 R |

FOREIGN PATENT DOCUMENTS

| | | | | |
|---|---|---|---|---|
| JP | 56-65999 | | 6/1981 | .......... C25D 21/10 |
| JP | 59-159347 A | * | 9/1984 | |
| JP | 61-170591 | | 8/1986 | ............ C25D 3/56 |
| JP | 61-177392 | | 8/1986 | ............ C25D 5/08 |
| JP | 63-028900 | | 2/1988 | .......... C25D 21/10 |
| JP | 08-002814 A | * | 1/1996 | |
| JP | 11-100698 | | 4/1999 | .......... C25D 21/10 |

* cited by examiner

*Primary Examiner*—Roy King
*Assistant Examiner*—Harry D. Wilkins, III
(74) *Attorney, Agent, or Firm*—Zilka-Kotab, PC

(57) ABSTRACT

The present invention overcomes the drawbacks and limitations described above by providing a paddle assembly having a paddle that moves in a bidirectional fashion for agitating solution in a container of a plating cell. A follower is coupled to the paddle. The follower engages a rotatable cam and is propelled along the cam as the cam rotates. A drive mechanism rotates the cam.

20 Claims, 5 Drawing Sheets

CAM DRIVEN PADDLE ASSEMBLY FOR A PLATING CELL

FIELD OF THE INVENTION

The present invention relates to electrochemical plating, and more particularly, this invention relates to a paddle drive assembly for use in an electrochemical plating cell.

BACKGROUND OF THE INVENTION

Electroplating is a common process for depositing a thin film of metal or alloy on a workpiece article such as various electronic components. In electroplating, the article is placed in a suitable electrolyte bath containing ions of a metal or alloy to be deposited. The article forms a cathode which is connected to the negative terminal of a power supply, and a suitable anode is connected to the positive terminal of the power supply. Electrical current flows between the anode and cathode through the electrolyte, and metal is deposited on the article by an electrochemical reaction.

In many electronic components it is desirable to deposit the metal film with a uniform thickness across the article and with uniformity of composition. However, the electroplating process is relatively complex and various naturally occurring forces may degrade the electroplating process. Most significantly, the electrical current or flux path between the anode and the cathode should be relatively uniform without undesirable spreading or curving to ensure uniform electrodeposition. Furthermore, as metal ions are depleted from the electrolyte, the uniformity of the electrolyte is decreased and must be suitably corrected to avoid degradation of the electroplating process. Also, debris particles are generated in the chemical reactions which can degrade the metal film on the article upon settling thereon.

Conventional electroplating equipment includes various configurations for addressing these as well as other problems for ensuring relatively uniform electroplating. Suitable circulation of the electrolyte is required for promoting electroplating uniformity, and care is required for properly aligning the cathode and anode to reduce undesirable flux spreading. For example, one type of conventional electroplating apparatus mounts the cathode at the bottom of an electrolyte bathing cell, with the anode being spaced above and parallel to the cathode. Since the article is at a common depth in the cell, the electroplating process is less susceptible to vertically occurring variations in the process due to buoyancy or gravity effects or other convection effects occurring during the process. For example, ion depletion in the electrolyte adjacent to the article will create local currents which will have a common effect along the horizontal extent of the article, but can vary vertically.

Also, in the electrodeposition of magnetic materials, e.g. permalloy, resulting gases are produced in the process which result in bubbles being generated at the article surface. Of course, bubbles are buoyancy driven upwardly, and horizontally positioning the article reduces adverse effects therefrom.

Enhanced uniformity in metal deposition is typically promoted by suitable agitation of the electrolyte in the cell. However, agitation by a unidirectional flow of the electrolyte is typically undesirable since it can cause monotonically decreasing mass-transfer effectiveness along the direction of flow.

Paddles positioned near the article are now commonly used to agitate the electrolyte in the cell. However, because plating is a long process, often occurring 24 hours a day, 7 days a week, the paddle must run continuously. If the paddle stops, the article being plated may have to be discarded, leading to delays in production and expense.

Thus, reliability is a key issue in any wafer fabrication process. The most reliable prior art paddle drive mechanism is a slider crank mechanism. This is attributable to a non-reversing motor, operating in one direction at a single speed, and no need for limit switches or sensors since over travel is impossible.

FIG. 1 depicts a prior art electroplating cell using a slider crank mechanism to drive the paddle, as described in U.S. Pat. No. 3,652,442. As shown, a bath container 110 is surrounded by a magnetic source 112. A cathode 114 is positioned in the bath container 110 and supports the object being plated. An anode 124 is positioned below the level of the fluid 130 in the bath container 110 and above the cathode 114. The bath is agitated during plating by a motor 132 which is connected to a carrier 136 by a linkage 134. When the motor 132 is energized, it pushes and pulls the carrier 136. The carrier 136 in turn moves a base portion 135 continuously in a path back and forth along the length of the cathode 114 and just above the surface of the cathode 114. As a result, a homogenization of the bath solution 130 occurs on the surface of the cathode 114.

The problem with this mechanism is that the base portion 135 follows a sinusoidal velocity profile, i.e., is not constant over the cathode 114. See FIG. 2, which depicts a velocity profile 200 of the base portion 135 across the cathode 114. This type of velocity profile results in uneven film deposition, as the base portion 135 moves faster over certain portions of the object being plated.

As shown in FIG. 2, the velocity of the base portion 135 increases towards its fastest point at about 90 degrees rotation, roughly corresponding to the center of the cathode 114, and decreases as it moves towards 180 degrees and away from the center of the cathode 114. The base portion 135 behaves similarly between 180 and 360 degrees of rotation, where it travels in the reverse direction.

It is more desirable to have a constant velocity over the object being plated. A constant velocity provides the most uniform film deposition.

The most common approach to achieving semi-constant velocity over the wafer is to use programmable motors, such as rotary motors with a worm screw, or linear conversion actuators. These motors provide a generally trapezoidal velocity profile. However, the problem with such drive systems is they are very complex, making them less reliable. This is true particularly in light of the long duty cycles involved in plating.

Programmable motors most often use steps or counts to determine position. If electrical noise causes the drive mechanism to lose (or gain) counts, the mechanism may travel too far, possibly impacting the cell wall, or not far enough and stall. To overcome this problem, the prior art has used limit switches. If a slider drive mechanism triggers a limit switch, the position of the drive assembly is reset to a default position before the drive is re-initiated in the desired mode. However, if this happens more than one or two times, the plating process may be adversely affected and the wafer may need to be discarded.

It is desirable to provide not only high uniform thickness and composition in an electrodeposition article, but also do so in an apparatus capable of reliable operation even when used for high-volume manufacturing. What is needed is a drive mechanism having the reliability of a slider crank with its non-reversing motor and absence of over travel and limit sensing requirements, with the functionality of programmable drive schemes.

DISCLOSURE OF THE INVENTION

The present invention overcomes the drawbacks and limitations described above by providing a paddle assembly having a paddle that moves in a bidirectional fashion for agitating solution in a container of a plating cell. A follower is coupled to the paddle. A drive mechanism rotates the cam. The follower engages a rotatable cam and is propelled along the cam as the cam rotates.

In one embodiment, a slider is coupled to the paddle. A guide is oriented parallel to a direction of movement of the paddle. The slider engages the guide and follows along the guide to help ensure linear movement of the paddle.

In another embodiment, the cam has a cylindrical shape. Note that this denotes the general outer shape, and can include a cylindrical, i.e., hollow, cam or a solid cam. The cam may have a lobe protruding therefrom. The follower engages the lobe, moving along the lobe as the cam rotates. Alternatively, or in combination with the lobe, the cam may have a groove therein. The follower would then engage the groove, moving along the groove as the cam rotates.

Preferably, the paddle moves across a wafer positioned in the fixture (cathode) of the plating cell at a substantially constant velocity. Ideally, an acceleration and deceleration of the paddle occurs over a thief region adjacent the wafer. In use, nickel and iron can be plated on the wafer, for example.

In an embodiment, multiple paddles are operatively coupled to the cam. In a further embodiment, the follower is positioned on a side of the cam opposite the container of the plating cell.

In yet another embodiment, a cross member extends across the container of the plating cell and is coupled to the paddle. Two sliders are coupled to the cross member towards opposite ends thereof. A second guide is positioned parallel the first guide. The sliders engage the guides for following therealong.

In a further embodiment, the cam is generally egg-shaped.

BRIEF DESCRIPTION OF THE DRAWINGS

For a better understanding of the nature and advantages of the present invention, as well as the preferred mode of use, reference should be made to the following detailed description read in conjunction with the accompanying drawings.

Prior Art

Prior Art

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1:
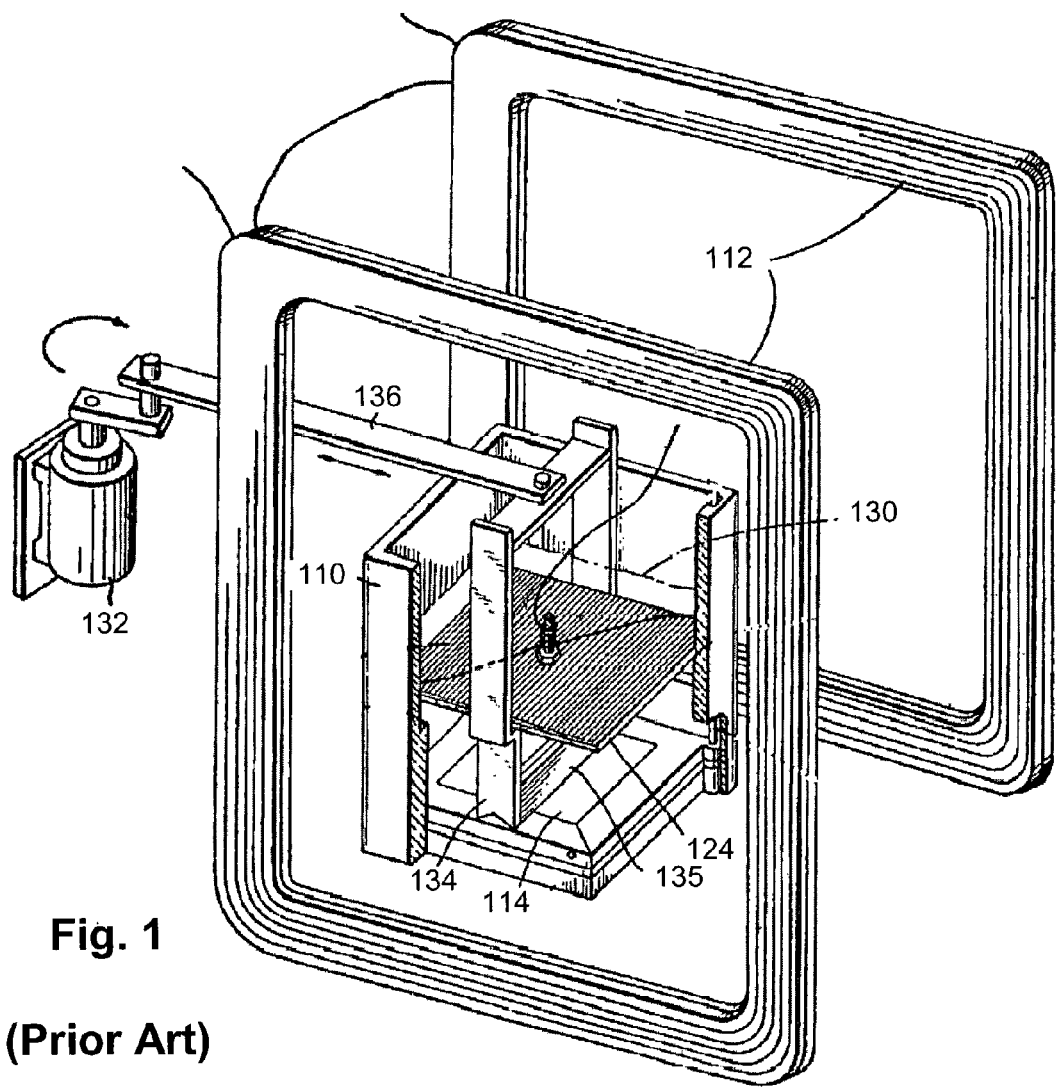
FIG. 1 illustrates a perspective view of a plating cell, in accordance with the prior art.
Figure 2:
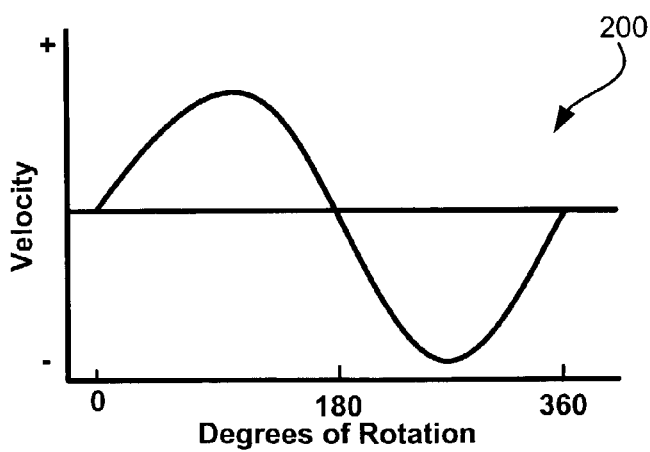
FIG. 2 is a graph of a velocity profile of the base portion of the prior art plating cell assembly shown in FIG. 1.
Figure 3:
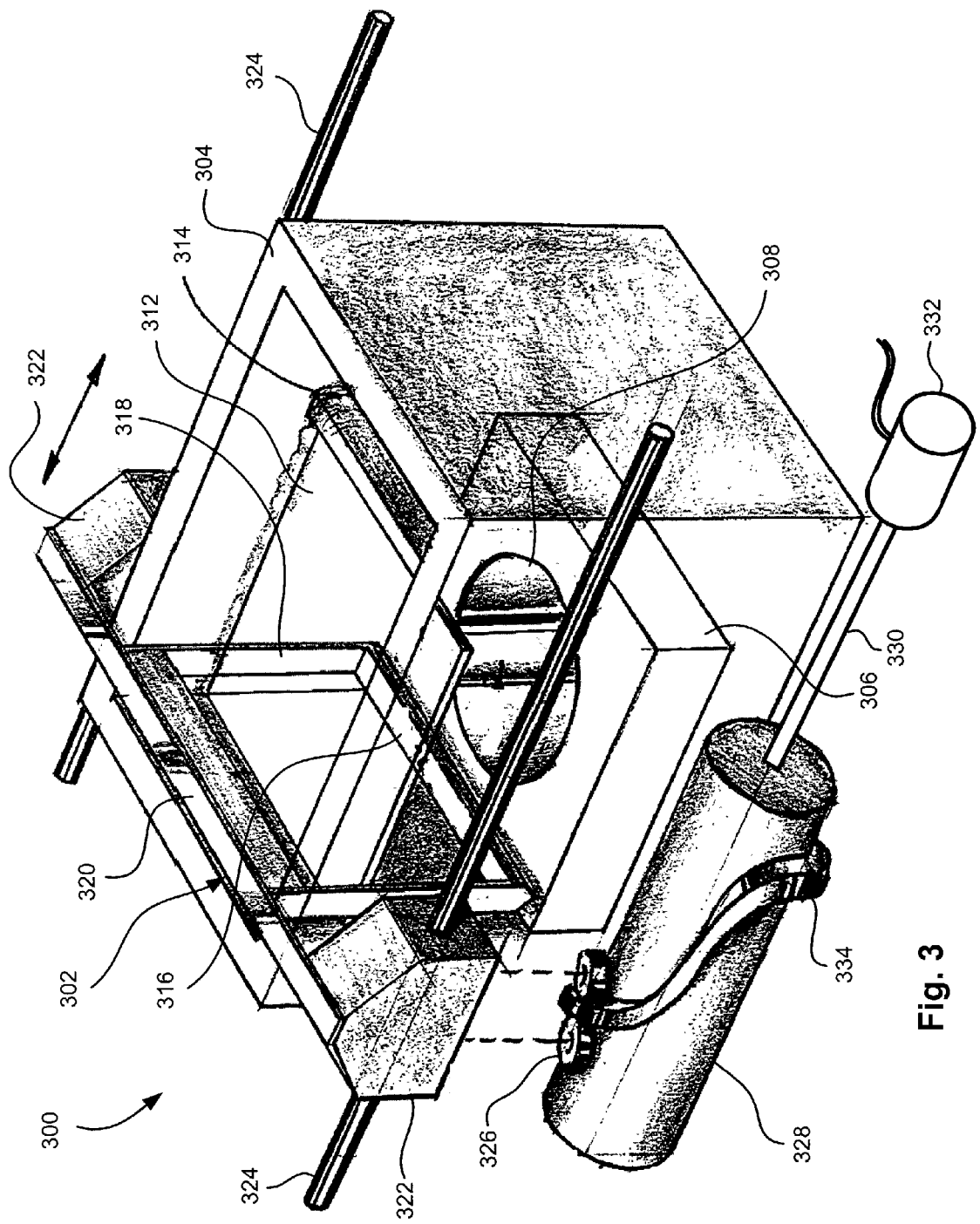
FIG. 3 is a perspective view of a plating cell according to one embodiment.

FIG. 3 depicts a plating cell 300 having a paddle assembly 302. The plating of nickel-iron alloys is performed in a container 304. The walls of the container 304 can be composed of a dielectric material such as glass or a plastic such as polycarbonate. A substrate 308 to be plated is positioned in a depression 310 (FIG. 4) in the cathode 306. Substrate materials 308 may include, for example, 1¼ inch sapphire, various ceramics or Si wafers covered with thermal $SiO_2$ and metallized with 50A to 200A of Ti and 100A to 1000A of Cu, Permalloy alloy, Au, etc.

An anode 312 is also positioned in the container 304 and may be composed of wire mesh screening or solid plates. The anode 312 may be composed of inert platinum, solid nickel or of a combination of an inert Pt sheet and a Ni wire mesh.

The bath level during plating is above the anode 312, so the anode 312 is immersed in the bath during plating. The bath level is held relatively constant by a solution overflow lip 314 over which the solution flows. The bath is constantly replenished and its temperature is controlled by recirculation from a reservoir (not shown) where it is refreshed by dispensing acid, iron and preferably also Na Saccharin, Na lauryl sulfate and/or $[Ni^{++}]$ if needed and constantly stirred by a reciprocating mixer 316 otherwise referred to herein as a paddle 316, which travels back and forth above the surface of cathode 306 at an approximate distance of ¹⁄₃₂ to ⅛ inch for providing agitation of the bath with minimal turbulence.

Figure 4:
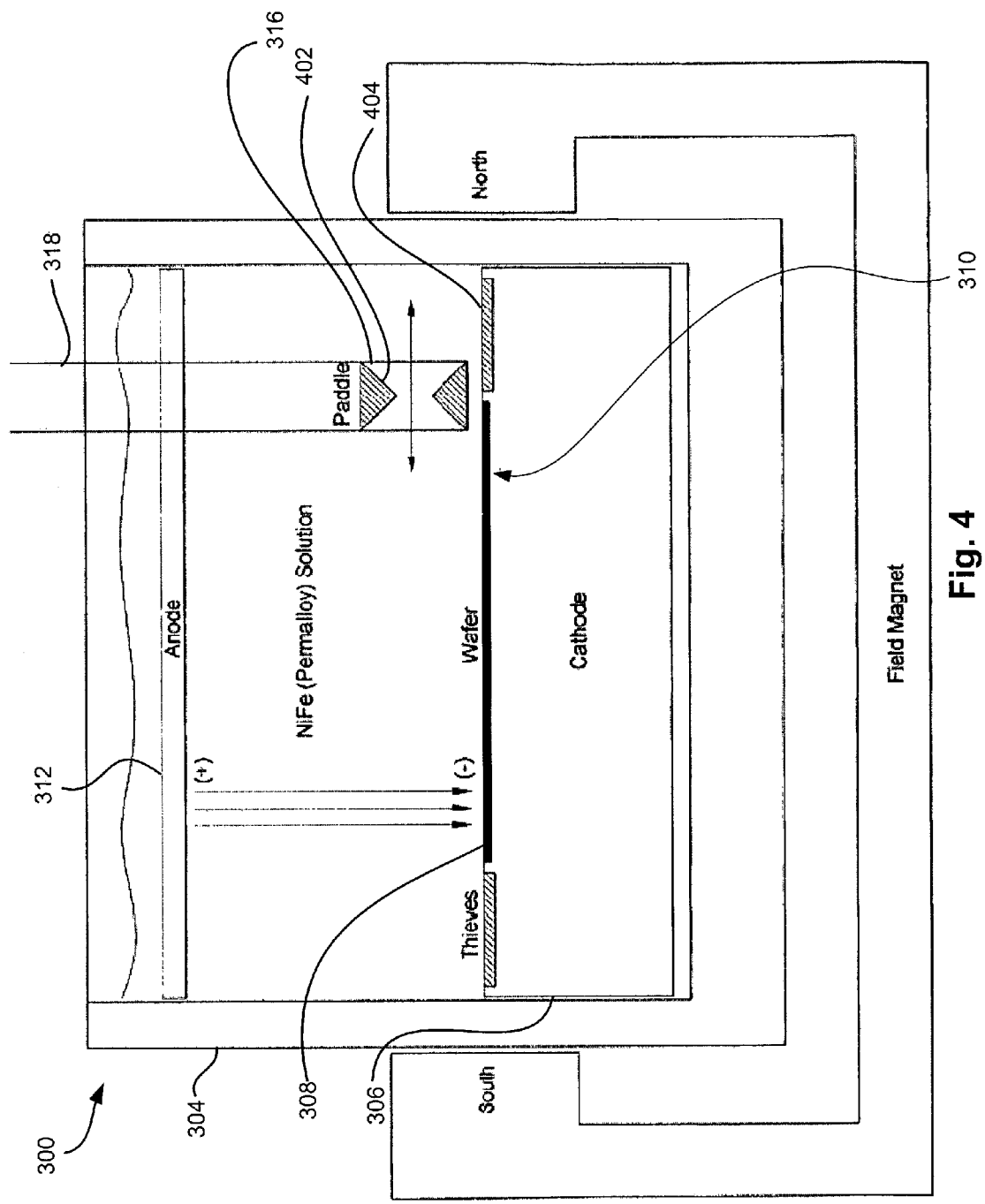
FIG. 4 is a cross sectional view of a plating cell according to one embodiment.

As shown in FIG. 4, the paddle 316 is in the exemplary form of a pair of vertically elongate, triangular (45°–90°–45°) blades 402 having spaced apart, parallel apexes defining therebetween a slot through which the fluid is flowable. The blades 402 of the paddle 316 have oppositely facing, parallel, flat bases with one of the bases being disposed parallel to and closely adjacent to the substrate 308.

The paddle 316 is carried by upright arms 318 which are secured at their top ends to transverse member 320. Sliders 322 are coupled to the traverse member 320. Each slider 322 engages a guide 324 oriented parallel to the direction of movement of the paddle 316. One or both sliders 322 is coupled to one or more followers 326 that engage the cam 328 and are propelled along the cam 328 as the cam 328 rotates about the shaft 330 of an electric motor 332.

As shown in FIG. 3, the cam 328 according to one embodiment is cylindrically shaped and has a lobe 334 extending therefrom in a continuous pattern about the exterior surface of the cam 328. As the cylindrical cam 328, or barrel cam, rotates, the followers 326 follow along the lobe 334, thereby moving the paddle assembly back and forth across the wafer formed on the substrate 308.

The follower 326 can be any suitable mechanism that will follow the lobe 334 of the cam 328. For example, the cam 328 followers 326 can be essentially ball bearing devices, rollers, etc. In a preferred embodiment, the cam followers 326 are oriented on a side of the cam 328 opposite the container 304 so that the followers 326 are at the farthest distance from the plating solution to prevent corrosion and/or clogging of the followers 326 and related assembly.

When the motor 332 is energized, the cam 328 drives the paddle 316 back and forth with reciprocal motion that has a substantially uniform rate over the length of the substrate 308, with acceleration and deceleration occurring over thieves 404, also known as deflectors, on the cathode 306. The shape of the lobe 334 of the cam 328 is designed to provide a substantially constant velocity of the paddle 316 over the substrate 308 with a constant rotation velocity of the cam 328. See FIG. 5.

Figure 5:
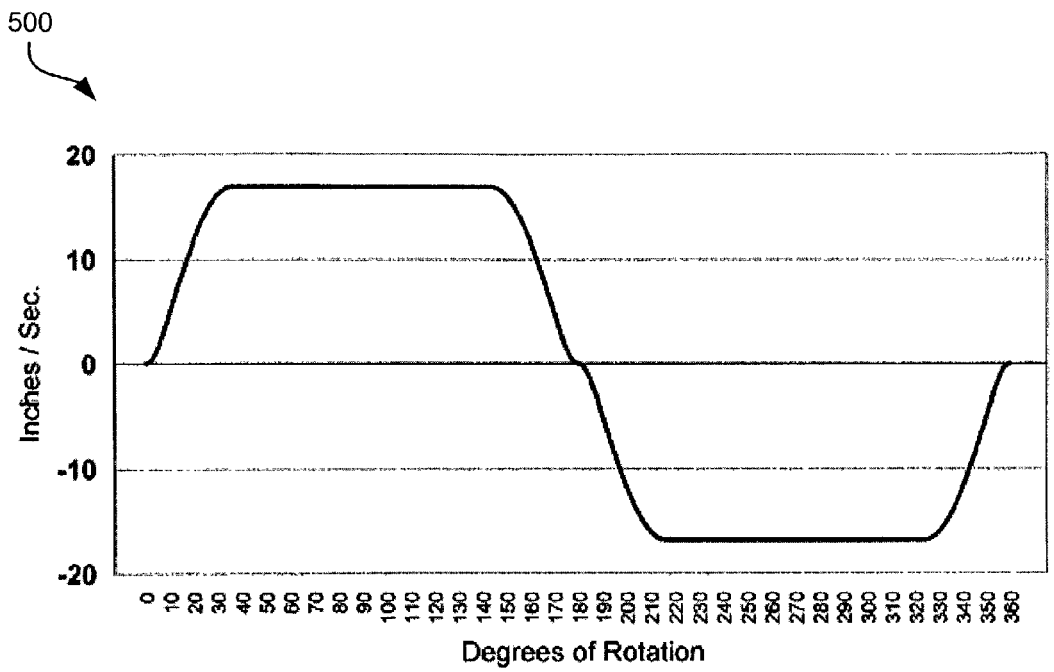
FIG. 5 is a chart showing an illustrative velocity profile of movement of a paddle over a cathode during one rotation of the cam.

FIG. 5 depicts an illustrative velocity profile 500 of movement of the paddle 316 over the cathode 306 for one rotation of the cam 328. As the cam 328 rotates from 0° to 40°, the paddle 316 speeds up. This range corresponds to movement of the paddle 316 over the nearest thief 404. The velocity of the paddle 316 remains substantially constant for a preselected rotation angle, here 100° (40°–140°). As the cam 328 rotates from 140° to 180°, the paddle 316 slows down. This range corresponds to movement of the paddle 316 over the opposite thief 404. Similarly, as the cam 328 rotates from 180° to 220°, the cam 328 speeds up in the reverse direction. The velocity of the paddle 316 in the reverse direction remains substantially constant for a preselected rotation angle, again 100° (220°–320°). As the cam 328 rotates from 320° to 360°, the paddle 316 slows down.

Figure 6:
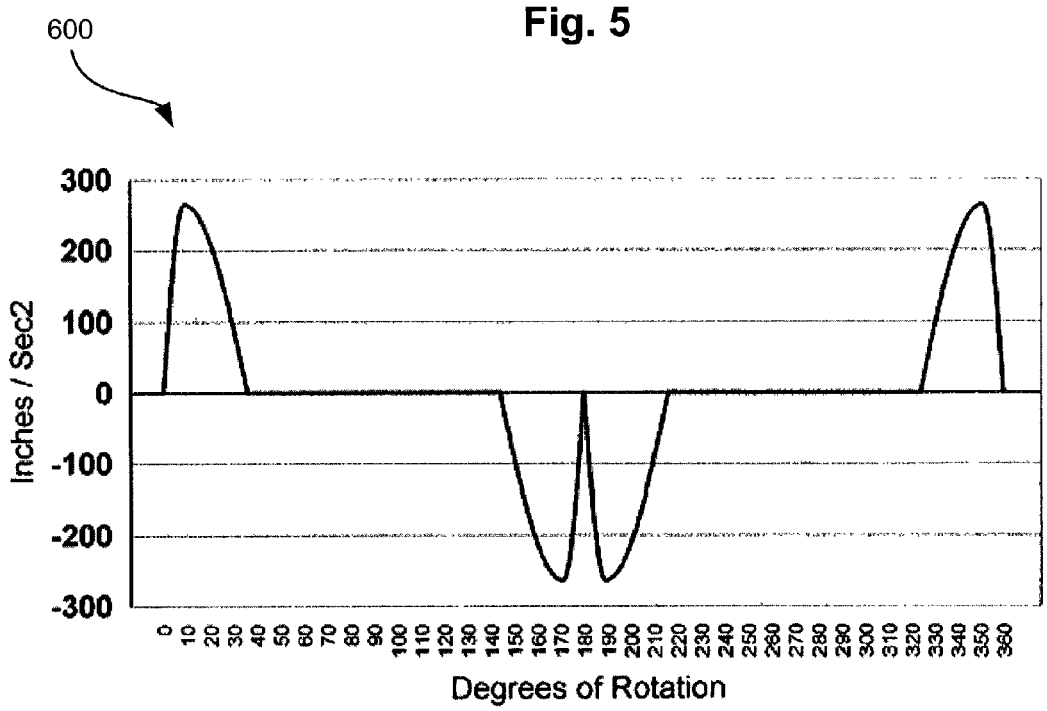
FIG. 6 is a graph depicting an exemplary acceleration profile of movement of the paddle over the cathode during one rotation of the cam.

FIG. 6 depicts an exemplary acceleration profile 600 of movement of the paddle 316 over the cathode 306 for one rotation of the cam 328. As shown, the acceleration of the paddle 316 in a first direction increases and decreases as the cam 328 rotates from 0° to 40°, and 320° to 360°, which corresponds to passage of the paddle 316 over the nearest thief 404. Similarly, the negative acceleration of the paddle 316 in the first direction increases and decreases as the cam 328 rotates from 140° to 180°, and 180° to 220°. There is no substantial acceleration of the paddle 316 as it passes across the length of the substrate 308.

Thus, a constant paddle velocity over the substrate 308 can be achieved without requiring deviation from a constant rotational velocity of the cam 328, even in the absence of limiting switches, etc. Total paddle travel is restricted to the length of the cam lobe, eliminating any need for limit switches or sensors since over travel is not possible. Further, the desired velocity profile can be obtained by changing the lobe shape.

The speed of the cycle (one rotation of the cam 328) can be changed by varying the rotation speed of the cam 328. By changing the velocity of the cam 328, the speed of the cycles of paddle movement over the wafer can be adjusted, but the same velocity profile shape is maintained. Likewise, new cams can be created for different sized wafers, providing similar results.

As a result of reciprocation of the blades 402 of the paddle 316, the bath solution near the cathode 306 is mixed thoroughly with a substantially laminar flow having little turbulence to avoid nonuniform polarization, while minimizing such things as the formation of a depletion zone which could lead to formation of an iron hydroxide precipitate with too high a pH and hydrogen evolution at the cathode 306 and avoids [$Fe^{++}$] depletion near the cathode 306 since the solubility product of [$Fe^{++}$][$OH^-$]$^2$ has much lower solubility than the solubility product [$Ni^{++}$][$OH^-$]$^2$. In addition, mixing the solution minimizes pitting caused by the formation of $H_2$ bubbles in the same spots on the surface of the cathode 306 at all times during electrolysis. The triangular cross-section of the blades 402 of the paddle 316 provides the set of confronting blunted apexes over which fluid flows with a flat base. In stirring, the fluid is forced to flow through the slot between the two blades 402 and over the upper blade 402 to mix with the bulk of the solution in the container 304. As the mixture passes through the slot, laminar flow at the cathode 306 surface is restored. The fluid entering the container 304 passes immediately through the slot when the paddle 316 is near the fluid inlet (not shown), and then the fresh fluid is carried along with the paddle 316 as it moves towards the opposite side of the container 304.

Consequently, films produced in the electroplating cell of this embodiment are uniformly thick throughout, and where metal alloys are being plated, the metal compositions which are normally a very strong function of the local current density will also be uniform over the entire film.

After performing the desired number of cycles, a home switch (not shown) can be used to stop rotation of the cam 328 such as when the paddle 316 is at one of the outer extremes of the lobe 334. For example, the cam 328 could stop when the paddle 316 is at the back of the container 304 to allow removal of the cathode and substrate 308.

According to one embodiment, the wafer is oriented vertically, where the paddle 316 moves horizontally or vertically along the vertically oriented wafer. Further, multiple paddles can be operatively coupled to the cam 328 so that all of the paddles move as the cam 328 rotates. Another embodiment may include multiple paddle drive assemblies coupled to the same cam and/or multiple cams.

Figure 7:
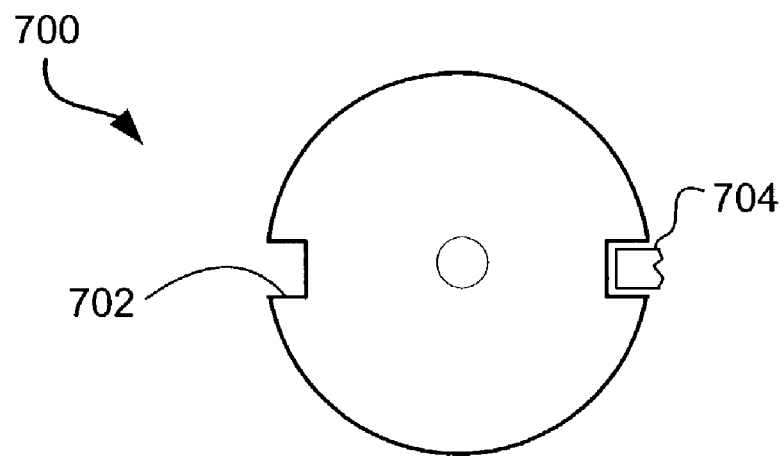
FIG. 7 is a side view of a cylindrical cam having a groove therein according to one embodiment.

As shown in FIG. 7, instead of an external lobe, the cam 700 may have a groove 702, in which case the followers would instead comprise a member 704 that follows the groove 702.

Figure 8:
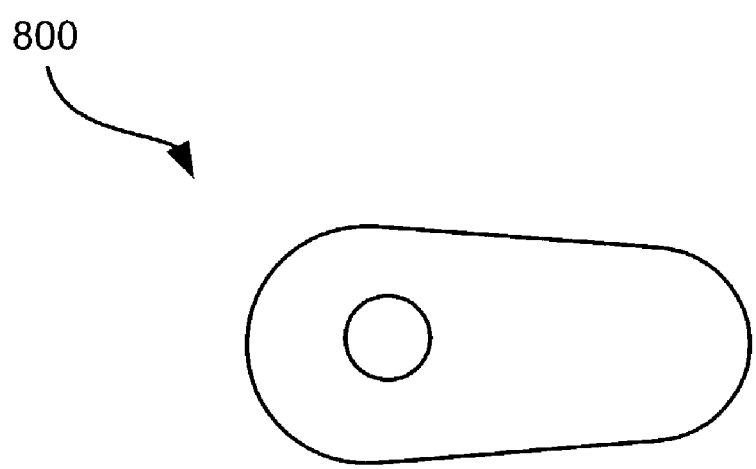
FIG. 8 is a side view of a plate cam according to one embodiment.

According to a further embodiment, shown in FIG. 8, a generally egg-shaped plate cam 800 may be used. In this embodiment, the plate cam 800 is shaped to produce the desired velocity profile. The followers would follow an outer edge of, or groove in, the plate cam 800. Note that cylindrical cam 328 of FIG. 3 is preferred as it is much smaller than the plate cam embodiment.

To make a cylindrical cam 328 with a lobe 334, a process of multiple cycles of hardening and grinding a cylinder (or solid rod) can be used. During each hardening and grinding cycle, the cylinder is hardened then ground along outer edges of the lobe 334. As another option, the cam 328 can be cast. The lobe can also be manufactured separately and coupled to the cylinder such as by welding.

A preferred material from which to construct the cam is stainless steel, as it is very durable and is also resistant to corrosion that could be caused by exposure to plating material that has splashed or leaked from the container 304 and onto the cam. Preferably, the material is 400 series stainless steel, because it has properties amenable to hardening.

As should be apparent to one skilled in the art, the embodiments described above are more reliable than prior art systems. These embodiments have less parts and do not require reversing or varying a rotational velocity of the motor. There is no need for limit switches, as the paddle can only travel as far as the lobe permits. Further, these embodiments provide more control over the velocity profile of the paddle.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A paddle assembly, comprising:
   (a) a paddle, the paddle moving in a bidirectional fashion for agitating solution in a container of a plating cell;
   (b) a follower coupled to the paddle;
   (c) a rotatable cam, the follower engaging the cam, the follower being propelled along the cam as the cam rotates, the paddle having a substantially constant velocity for a preselected rotation angle of the cam, and an acceleration and deceleration for another preselected rotation angle of the cam, the preselected rotation angles being less than 360°; and
   (d) a drive mechanism for rotating the cam.

2. The paddle drive assembly as recited in claim 1, and further comprising a slider coupled to the paddle, and a guide oriented parallel to a direction of movement of the paddle and positioned adjacent the container, the slider engaging the guide for following therealong.

3. The paddle drive assembly as recited in claim 1, wherein the cam has a cylindrical shape, the follower returning to a same point upon each full rotation of the cam.

4. The paddle drive assembly as recited in claim 3, wherein the cam has a lobe protruding therefrom, wherein the follower engages the lobe, the follower moving unidirectionally along the lobe as the cam rotates.

5. The paddle drive assembly as recited in claim 3, wherein the cam has a groove therein, wherein the follower engages the groove, the follower moving along the groove as the cam rotates.

6. The paddle drive assembly as recited in claim 1, wherein the paddle moves across a wafer positioned in the container of the plating cell at a substantially constant velocity.

7. The paddle drive assembly as recited in claim 6, wherein an acceleration and deceleration of the paddle occurs over a thief region adjacent the wafer.

8. The paddle drive assembly as recited in claim 6, wherein nickel and iron are being plated on the wafer.

9. The paddle drive assembly as recited in claim 1, wherein the paddle has opposing blades, the blades having blunt apexes facing each other, a blade closest a cathode of the container having a relatively flat surface facing the cathode, the solution being allowed to pass between the blades.

10. The paddle drive assembly as recited in claim 1, wherein the follower is positioned on a side of the cam opposite the container of the plating cell.

11. The paddle drive assembly as recited in claim 1, and further comprising a cross member extending across the container of the plating cell and coupled to the paddle, a slider being coupled to the cross member towards opposite ends thereof, and a pair of guides oriented parallel to a direction of movement of the paddle, the sliders engaging the guides for following therealong.

12. The paddle drive assembly as recited in claim 1, wherein the follower is propelled along the cam in a direction parallel to an axis of rotation of the cam.

13. An electroplating cell assembly, comprising:
    (a) a container;
    (b) a paddle positioned in the container, the paddle moving in a bidirectional fashion across a wafer in the container for agitating solution in the container;
    (c) a slider coupled to the paddle;
    (d) a first guide oriented parallel to a direction of movement of the paddle, the slider engaging the first guide for following therealong;
    (e) a follower coupled to the paddle;
    (f) a rotatable cylindrically shaped cam, the follower engaging the cam, the follower being propelled along the cam in a direction parallel to an axis of rotation of the cam as the cam rotates, the paddle having a substantially constant velocity for a preselected rotation angle of the cam, and an acceleration and deceleration for another preselected rotation angle of the cam, the preselected rotation angles being less than 360°, wherein the paddle makes one complete bidirectional movement and returns to a common position each time the cam makes one 360° rotation; and
    (g) a drive mechanism for rotating the cam.

14. The electroplating cell assembly as recited in claim 13, wherein the cam has a lobe protruding therefrom, wherein the follower engages the lobe, the follower moving along the lobe unidirectionally as the cam rotates.

15. The electroplating cell assembly as recited in claim 13, wherein the cam has a groove therein, wherein the follower engages the groove, the follower moving along the groove as the cam rotates.

16. The electroplating cell assembly as recited in claim 13, wherein the paddle moves across a wafer positioned in the container at a substantially constant velocity.

17. The electroplating cell assembly as recited in claim 16, wherein an acceleration and deceleration of the paddle occurs over a thief region adjacent the wafer.

18. The electroplating cell assembly as recited in claim 13, and further comprising multiple paddles operatively coupled to the cam.

19. The electroplating cell assembly as recited in claim 13, wherein the follower is positioned on a side of the cam opposite the container.

20. The electroplating cell assembly as recited in claim 13, and further comprising a cross member extending across a container and coupled to the paddle, a second slider, a second guide parallel the first guide, the sliders being coupled to the cross member towards opposite ends thereof, the sliders engaging the guides for following therealong.

* * * * *